(12) United States Patent
Yang et al.

(10) Patent No.: US 8,230,299 B2
(45) Date of Patent: Jul. 24, 2012

(54) INTERLEAVING SCHEME FOR AN LDPC CODED QPSK/8PSK SYSTEM

(75) Inventors: Ming Yang, Beijing (CN); Juntan Zhang, North Potomac, MD (US); Zhiyong Wu, Beijing (CN); Fengwen Sun, Germantown, MD (US)

(73) Assignee: Availink, Inc., Germantown, MD (US)

( * ) Notice: Subject to any disclaimer, the term of this patent is extended or adjusted under 35 U.S.C. 154(b) by 31 days.

(21) Appl. No.: 12/715,194

(22) Filed: Mar. 1, 2010
(Under 37 CFR 1.47)

(65) Prior Publication Data

US 2011/0258521 A1    Oct. 20, 2011

Related U.S. Application Data

(63) Continuation of application No. 11/813,202, filed as application No. PCT/CN2006/002426 on Sep. 18, 2006, now abandoned.

(51) Int. Cl.
*G06F 11/00* (2006.01)
(52) U.S. Cl. ....................................................... 714/758
(58) Field of Classification Search .................... 714/758
See application file for complete search history.

(56) References Cited

U.S. PATENT DOCUMENTS

| | | | |
|---|---|---|---|
| 5,946,047 A | 8/1999 | Levan | |
| 6,154,871 A | 11/2000 | Claydon et al. | |
| 6,320,917 B1 | 11/2001 | Stott et al. | |
| 6,421,387 B1 | 7/2002 | Rhee | |
| 6,522,635 B1 | 2/2003 | Bedwell | |
| 6,963,622 B2 | 11/2005 | Eroz et al. | |
| 6,973,140 B2 | 12/2005 | Hoffman et al. | |
| 7,065,703 B2 | 6/2006 | Krieger | |
| 8,028,219 B2 * | 9/2011 | Zhang et al. | ............ 714/767 |
| 2004/0221223 A1 | 11/2004 | Yu | |
| 2005/0058229 A1 | 3/2005 | Alagha | |
| 2005/0066262 A1 | 3/2005 | Eroz et al. | |
| 2005/0089068 A1 | 4/2005 | Sun et al. | |
| 2005/0138519 A1 | 6/2005 | Boutillon et al. | |
| 2005/0180534 A1 | 8/2005 | Brotje et al. | |
| 2005/0229090 A1 | 10/2005 | Shen et al. | |
| 2005/0271160 A1 | 12/2005 | Eroz et al. | |
| 2006/0013333 A1 | 1/2006 | Chen | |
| 2006/0015791 A1 | 1/2006 | Kikuchi et al. | |
| 2006/0072684 A1 | 4/2006 | Feher | |
| 2006/0085720 A1 | 4/2006 | Tran et al. | |
| 2006/0115027 A1 | 6/2006 | Srebranig | |

(Continued)

FOREIGN PATENT DOCUMENTS

CN     1481130 A     3/2004

(Continued)

OTHER PUBLICATIONS

Hou, J. et al., Capacity-Approaching Bandwidth-Efficient Coded Modulation Schemes Based on Low-Density Parity-Check Codes, IEEE Transactions on Information Theory, 49(9):2141-2155 (2003).

(Continued)

*Primary Examiner* — Bryce Bonzo
(74) *Attorney, Agent, or Firm* — Greenblum & Bernstein, P.L.C.

(57) ABSTRACT

An approach is provided for interleaving low density parity check (LDPC) encoded bits in QPSK/8PSK modulation systems. By assigning the bits determining modulation symbols based on different bit degrees, one can efficiently find the desirable tradeoff between error performance and error floor provided by the LDPC codes in use.

6 Claims, 9 Drawing Sheets

U.S. PATENT DOCUMENTS

2006/0156169 A1 7/2006 Cameron et al.
2007/0011570 A1* 1/2007 Jeong et al. .................. 714/758

FOREIGN PATENT DOCUMENTS

| DE | 101 34 764 A1 | 1/2003 |
| --- | --- | --- |
| EP | 1 701 450 A1 | 9/2006 |
| EP | 1 901 433 A1 | 3/2008 |
| JP | 60-206284 A | 10/1985 |
| JP | 2000-78116 A | 3/2000 |
| KR | 2002-0001039 A | 1/2002 |
| WO | 2006/027897 | 3/2006 |

OTHER PUBLICATIONS

Li, Y. et al., Bit-Reliability Mapping in LDPC-Coded Modulation Systems, IEEE Communications Letters, 9(1):1-3 (2005).

Lu, J. et al., M-PSK and M-QAM BER Computation Using Signal-Space Concepts, IEEE Transactions on Communications, 47(2):181-184 (1999).

Niu, H. et al., Threshold of LDPC coded BICM for Rayleigh fading: Density evolution and EXIT chart, IEEE Communications Society, 2422:2427 (2004).

Tan, J. et al., Analysis and Design of Symbol Mappers for Iteratively Decoded BICM, IEEE Transactions on Wireless Communications, 4(2):662-672 (2005).

The European Search Report, dated Apr. 22, 2010, cited in related European Patent Application No. 07016670.7, filed Aug. 24, 2007.

Castro, M.A.V. et al., Encapsulation and framin efficiency of DVB-S2 satellite systems, Vehicular Technology Conference 2004. IEEE. 59(5):2896-2900 (May 2004).

Chen, J. et al., Near Optimum universal belief propagation based decoding of low-density parity check codes, Communications, IEEE Transactions, Digital Object Identifier 10.1109/26.990903, 50(3):406-414 (Mar. 2002).

Karam, G. et al., A variable-rate QPSK demodulator for digital satellite TV reception, IBC 94. International Broadcasting Convention (Conf. Publ. No. 397) IEEE, London, UK 1994, 646-50 (Abstract).

Morello, A. et al., DVB-S2, the second generation standard for satellite broadcasting and unicasting, International Journal of Satellite Communications and Networking, 22:249-68. Wiley, UK (May-Jun. 2004).

Ohkawa, M. et al., Comets 21-GHz advanced satellite broadcasting experiments-evaluation of trellis-coded 8-PSK performance, IEEE Transactions of Broadcasting, 46(2):144-151 (Jun. 2000).

Saito, T. et al., Transmission System for Satellite ISDB, Global Telecommunications Conference 1998. GLOBECOM 98. The Bridge to Global Integration. IEEE, 5:2942-2947 (Nov. 1998).

* cited by examiner $$H = \begin{bmatrix} 0 & 1 & 0 & 1 & 0 & 0 \\ 1 & 1 & 0 & 0 & 0 & 0 \\ 1 & 0 & 0 & 0 & 1 & 1 \\ 0 & 0 & 1 & 0 & 0 & 1 \end{bmatrix}$$

INTERLEAVING SCHEME FOR AN LDPC CODED QPSK/8PSK SYSTEM

RELATED APPLICATIONS

This application is a continuation of U.S. patent application Ser. No. 11/813,202, filed Jun. 29, 2007, which is the U.S. National Stage of International Application No. PCT/CN2006/002426, filed Sep. 18, 2006 and claims the benefit thereof. This application relates to application Ser. No. 11/813,201, filed Jun. 29, 2007, application Ser. No. 11/813,177, filed Jun. 29, 2007, and application Ser. No. 11/813,206, filed Jun. 29, 2007.

TECHNICAL FIELD OF THE INVENTION

The present invention relates to interleaving low density parity check ("LDPC") encoded bits in Quadrature Phase Shifting Keying ("QPSK")/8PSK modulation systems. In particular, by assigning he bits determining modulation symbols based on different bit degrees, one can efficiently find the desirable tradeoff between error performance and error floor provided by the LDPC codes in use.

BACKGROUND OF THE INVENTION

In "*Bit-Reliability Mapping in LDPC-Codes Modulation systems*," Yan Li and William Ryan, IEEE Communications Letters, vol. 9, no. 1, January 2005, the authors studied the performance of LDPC-coded modulation systems with 8PSK. With the proposed bit reliability mapping strategy, about 0.15 dB performance improvement over a non-interleaving scheme is achieved. The authors also explain the reason for this improvement using an analysis tool called EXIT charts. In the interleaving approach, one interleaving approach is considered and has been shown to offer a better performance over non-interleaving systems, i.e., in the bit-reliability mapping scheme less reliable LDPC codes bits are mapped to the lower level modulation bits and the more reliable bits are mapped to the higher level bits.

Forward error control (FEC) coding is critical for communications systems to ensure reliable transmission of data across noisy communication channels. Based on Shannon's theory, these communication channels exhibit fixed capacity that can be expressed in terms of bits per symbol at certain signal to noise ratio (SNR), which is defined as the Shannon limit. One of the most important research areas in communication and coding theory is to devise coding schemes offering performance approaching the Shannon limit with reasonable complexity. It has been shown that LDPC codes with belief propagation (BP) decoding provide performance close to the Shannon limit with tractable encoding and decoding complexity.

LDPC codes were first described by Gallager in the 1960s. LDPC codes perform remarkably close to the Shannon limit. A binary (N, K) LDPC code, with a code length N and dimension K, is defined by a parity check matrix H of (N−K) rows and N columns. Most entries of the matrix H are zeros and only a small number the entries are ones, hence the matrix H is sparse. Each row of the matrix H represents a check sum, and each column represents a variable, e.g., a bit or symbol. The LDPC codes described by Gallager are regular, i.e., the parity check matrix H has constant-weight rows and columns.

Regular LDPC codes can be extended to irregular LDPC codes, in which the weight of rows and columns vary. An irregular LDPC code is specified by degree distribution polynomials v(x) and c(x), which define the variable and check node degree distributions, respectively. More specifically, let $$v(x) = \sum_{j=1}^{d_{v\,max}} v_j x^{j-1}$$

and $$c(x) = \sum_{j=1}^{d_{c\,max}} c_j x^{j-1}$$

where the variables $d_{v\,max}$ and $d_{c\,max}$ are a maximum variable node degree and a check node degree, respectively, and $v_j(c_j)$ represents the fraction of edges emanating from variable (check) nodes of degree j.

While irregular LDPC codes can be more complicated to represent and/or implement, it has been shown, both theoretically and empirically, that irregular LDPC codes with properly selected degree distributions outperform regular LDPC codes. FIG. 1 illustrates a parity check matrix representation of an exemplary irregular LDPC code of codeword length six.

LDPC codes can also be represented by bipartite graphs, or Tanner graphs. In Tanner graph, one set of nodes called variable nodes (or bit nodes) corresponds to the bits of the codeword and the other set of nodes called constraints nodes (or check nodes) corresponds the set of parity check constrains which define the LDPC code. Bit nodes and check nodes are connected by edges. A bit node and a check node is said to be neighbors or adjacent if they are connected by an edge. Generally, it is assumed that a pair of nodes is connected by at most one edge.

FIG. 2 illustrates a bipartite graph representation of the irregular LDPC code illustrated in FIG. 1. The LDPC code represented by FIG. 1 is of codeword length 6 and has 4 parity checks. As shown in FIG. 1, there are a total of 9 one's in the parity check matrix representation of the LDPC code. Therefore in the Tanner graph representation shown in FIG. 2, 6 bit nodes 201 are connected to 4 check nodes 202 by 9 edges 203.

LDPC codes can be decoded in various ways, such as majority-logic decoding and iterative decoding. Due to the structures of their parity check matrices, LDPC codes are majority-logic decodable. Although majority-logic decoding requires the least complexity and achieves reasonably good error performance for decoding, some types of LDPC codes with relatively high column weights in their parity check matrices (e.g., Euclidean geometry LDPC and projective geometry LDPC codes), whereas iterative decoding methods have received more attentions due to their better performance versus complexity tradeoffs. Unlike majority-logic decoding, iterative decoding processes the received symbols recursively to improve the reliability of each symbol based on constraints that specify the code. In the first iteration, the iterative decoder only uses the channel output as input, and generates reliability output for each symbol. Subsequently, the output reliability measures of the decoded symbols at the end of each decoding iteration are used as inputs for the next iteration. The decoding process continues until a certain stopping condition is satisfied. Then final decisions are made, based on the output reliability measures of the decoded symbols from the last iteration. According to the different properties of reliability measures used at each iteration, iterative decoding algorithms can be further divided into hard decision, soft decision and hybrid decision algorithms. The corresponding popular algorithms are iterative bit-flipping (BF), belief propagation (BP), and weighted bit-flipping (WBF) decoding, respectively. The BP algorithm has been proven to provide maximum likelihood decoding given the underlying Tanner graph is acyclic. Therefore, it realistically becomes the most popular decoding method. The invention described below, however, only discusses BP decoding of LDPC codes.

BP for LDPC codes is a kind of message passing decoding. Messages transmitted along the edges of the graph are log-likelihood ratio (LLR) log $p_0/p_1$ associated with variable nodes corresponding to codeword bits. In this expression $p_0$, and $p_1$ denote the probability that the associated bit takes value 0 and 1, respectively. BP decoding has two steps, horizontal step and vertical step. In the horizontal step, each check node $c_m$ sends to each adjacent bit $b_n$ a check-to-bit message which is calculated based on all bit-to-check messages incoming to the check $c_m$ except the one from bit $b_n$. In the vertical step, each bit node $b_n$ sends to each adjacent check node $c_m$ a bit-to-check message which is calculated based on all check-to-bit messages incoming to the bit $b_n$ except the one from check node $c_m$. These two steps are repeated until a valid codeword is found or the maximum number of iterations is reached.

Because of its remarkable performance with BP decoding, irregular LDPC codes are among the best for many applications. Various irregular LDPC codes have been accepted or being considered for various communication and storage standards, such as DVB-S2/DAB, wireline ADSL, IEEE 802.11n, and IEEE 802.16. While considering applying irregular LDPC codes to video broadcasting systems, one often encounter a trouble called error floor.

The error floor performance region of an LDPC decoder can be described by the error performance curve of the system. The LDPC decoder system typically exhibits sharp decrease in error probability as the quality of the input signal improves. The resulting error performance curves are conventionally called waterfall curve and the corresponding region is called waterfall region. At some point, however, the decrease of error probability with input signal quality increase decreases. The resulting flat error performance curve is called error floor. FIG. 3 illustrates an exemplary FER performance curve containing waterfall region 301 and error floor region 302 of an irregular LDPC code.

SUMMARY OF THE INVENTION

The present invention discloses an interleaving approach in which for LDPC codes bits with any level of reliability, a portion of lower level modulation bits and a portion of higher level modulation bits are mapped. Given a specific structure of an LDPC code and the modulation method, the optimal portion of lower and higher level modulation bits can be determined through a theoretical algorithm called density evolution.

In one embodiment of the invention, there is a digital communications system to interleave bits in a QPSK modulation system with FEC code, comprising a transmitter to generate signal wave from alphabet to a signal mapper, wherein interleaving is a non-consecutive mapping that generates a smallest Using carefully selected check and bit node degree distributions and Tanner graph constructions, the LDPC codes in the present invention have good threshold which reduce transmission power for a given FER performance.

The threshold of an LDPC code is defined as the smallest SNR value at which as the codeword length tends to infinity, the bit error probability can be made arbitrarily small.

Different applications have different requirements for the thresholds and error floor of LDPC codes. Therefore, it is desired to develop a method to determine the mapping scheme in QPSK/8PSK systems to provide required threshold while keeping error floor lower than specific criteria.

BRIEF DESCRIPTION OF THE DRAWINGS

The present invention is illustrated by way of example, and not by way of limitation, in the figures of the corresponding drawings and in which like reference numerals refer to similar elements and in which:

FIG. 1 is a parity check matrix representation of an exemplary irregular LDPC code of codeword length six.

DETAILED DESCRIPTION OF THE INVENTION

Although the present invention is described with respect to LDPC codes, it is recognized that the bit labeling approach can be utilized with other codes. Further, this approach can be implemented with uncoded systems.

Figure 2:
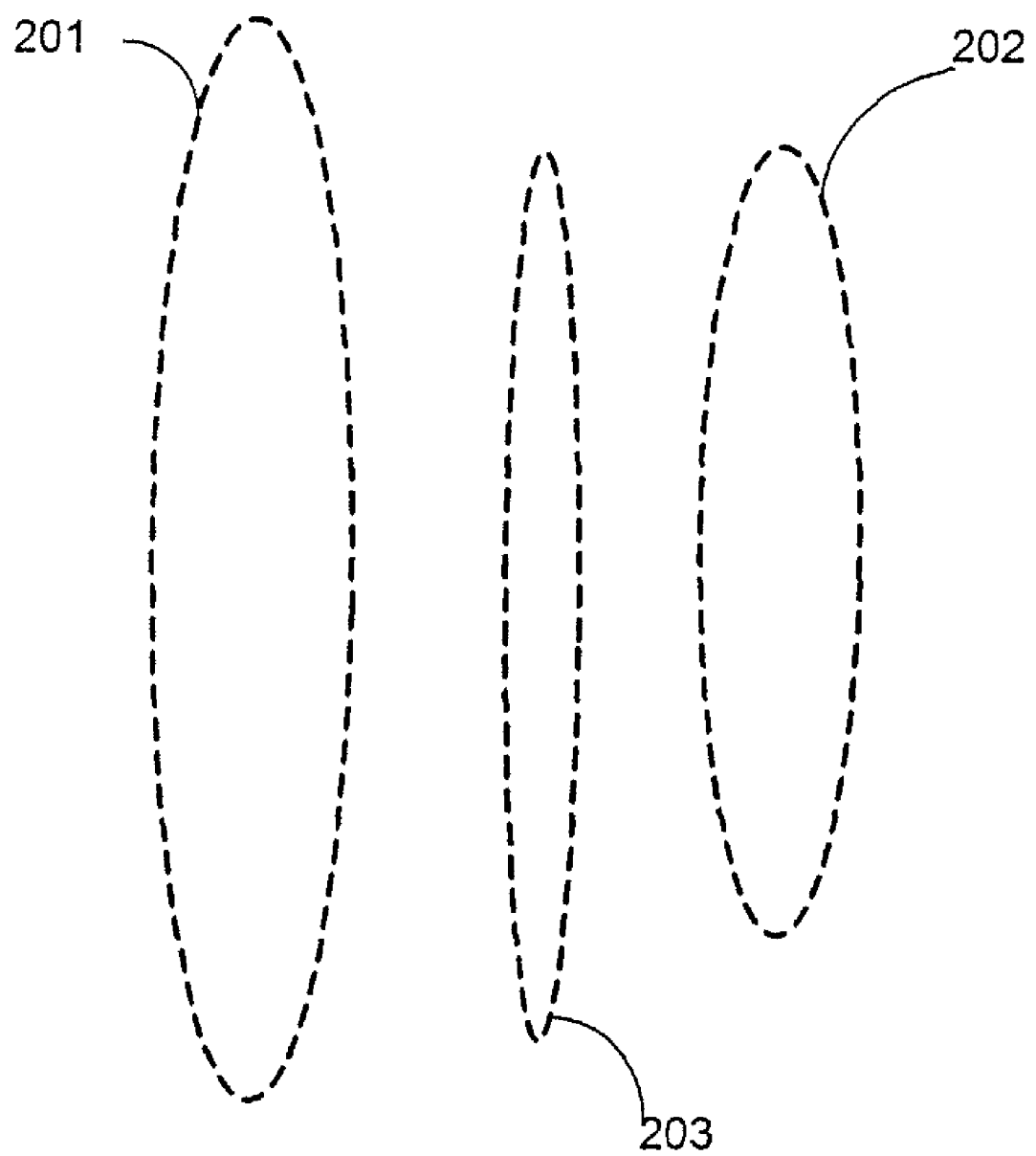
FIG. 2 illustrates a bipartite graph representation of the irregular LDPC code illustrated in FIG. 1.
Figure 3:
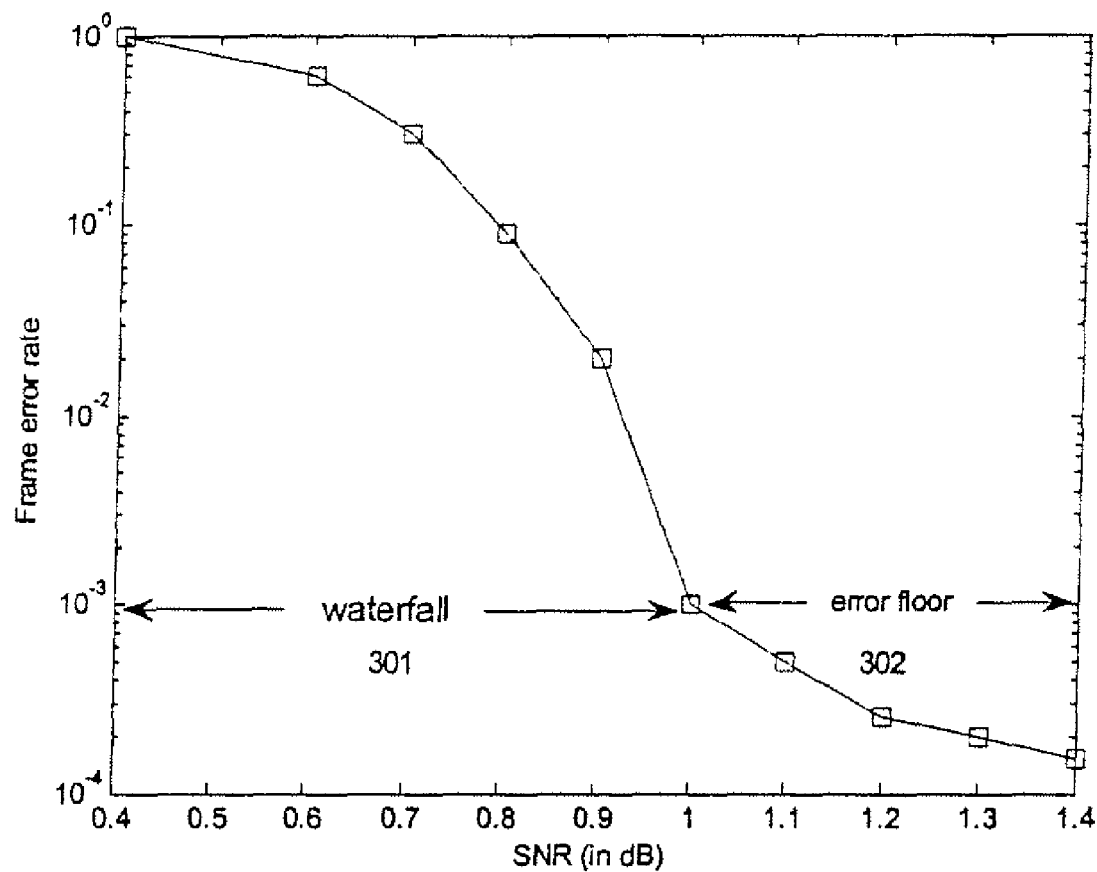
FIG. 3 illustrates an exemplary FER performance curve including waterfall and error floor region of an irregular LDPC code.
Figure 4:
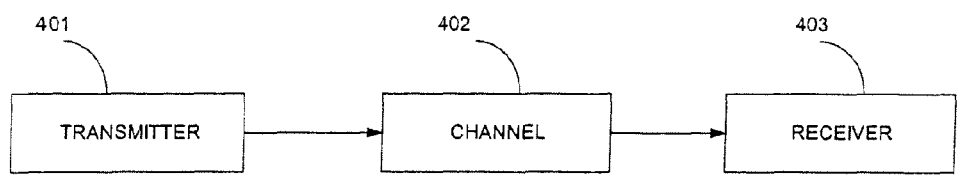
FIG. 4 is an exemplary communications system which employs LDPC codes and interleavor, according to an embodiment of the present invention.

FIG. 4 is a diagram of a communications system employing LDPC codes with an interleaver, according to an embodiment of the present invention. The communications system includes a transmitter 401 which generates signal waveforms across a communication channel 402 to a receiver 403. The transmitter 401 includes a message source producing a discrete set of possible messages. Each of these messages corresponds a signal waveform. The waveforms enter the channel 402 and are corrupted by noise. LDPC codes are employed to reduce the disturbances introduced by the channel 402. Given an LDPC code and the desired error floor level, an interleaver and a deinterleaver are used in the transmitter 401 and the receiver 403, respectively, based on an interleaving rule to produce a good threshold.

Figure 5:
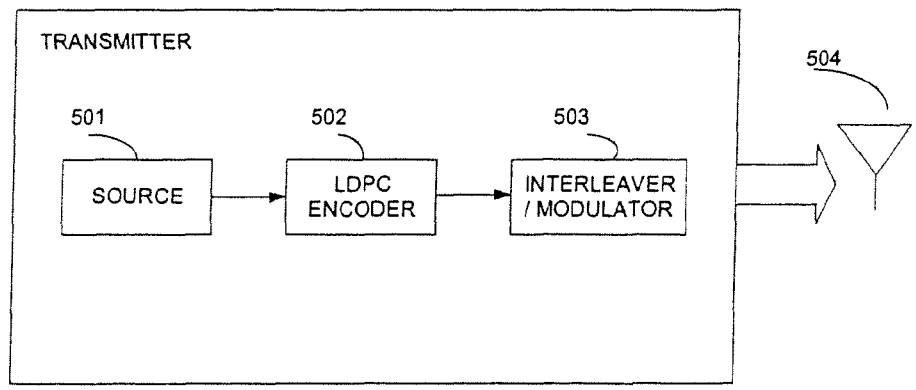
FIG. 5 illustrates an exemplary transmitter in FIG. 4.

FIG. 5 depicts an exemplary transmitter in the communications system of FIG. 4 which employs LDPC codes and interleaver. The LDPC encoder 502 encodes information bits from source 501 into LDPC codewords. The mapping from each information block to each LDPC codeword is specified by the parity check matrix (or equivalently the generator matrix) of the LDPC code. The LDPC codeword is interleaved and modulated to signal waveforms by the interleaver/modulator 503. These signal waveforms are sent to a transmit antenna 504 and propagated to a receiver shown in FIG. 6.

Figure 6:
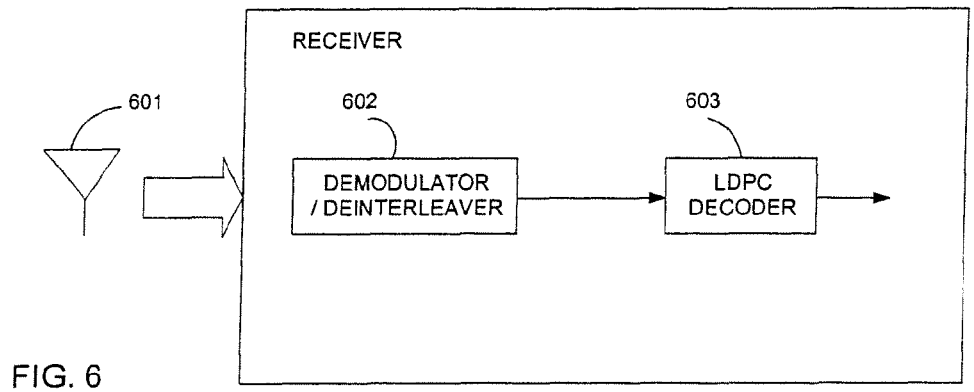
FIG. 6 illustrates an exemplary receiver in FIG. 4.

FIG. 6 depicts an exemplary receiver in FIG. 4 which employs LDPC codes and deinterleaver. Signal waveforms are received by the receiving antenna 601 and distributed to demodulator/deinterleavor 602. Signal waveforms are demodulated by demodulator and deinterleaved by deinterleavor and then distributed to a LDPC decoder 603 which iteratively decodes the received messages and output estimations of the transmitted codeword. The deinterleaving rule employed by the demodulator/deinterleaver 602 should match with the interleaving rule employed by the interleaver/modulator 503. That is to say, the deinterleaving scheme should follow an anti-rule of the interleaving scheme.

Given an LDPC code and a modulation scheme (QPSK or 8PSK), we define the optimal interleaving as the non-consecutive mapping arrangement which generates the best threshold of the corresponding LDPC code predicted by density evolution.

QPSK

Figure 7:
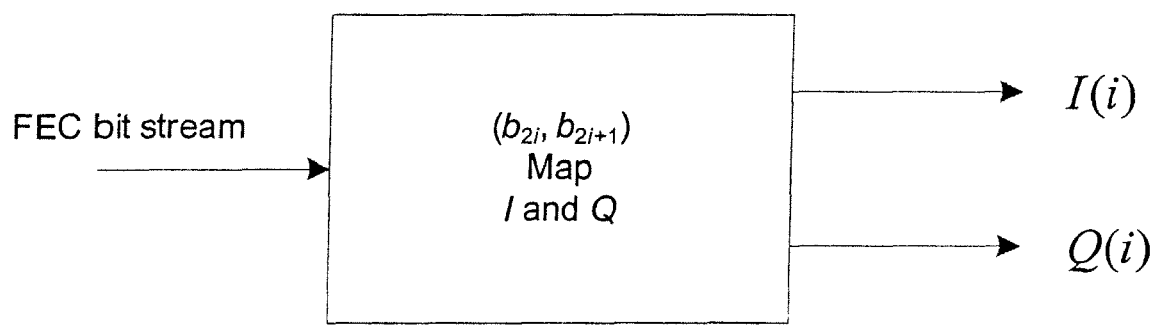
FIG. 7 illustrates the bit mapping block in QPSK modulation.
Figure 8:
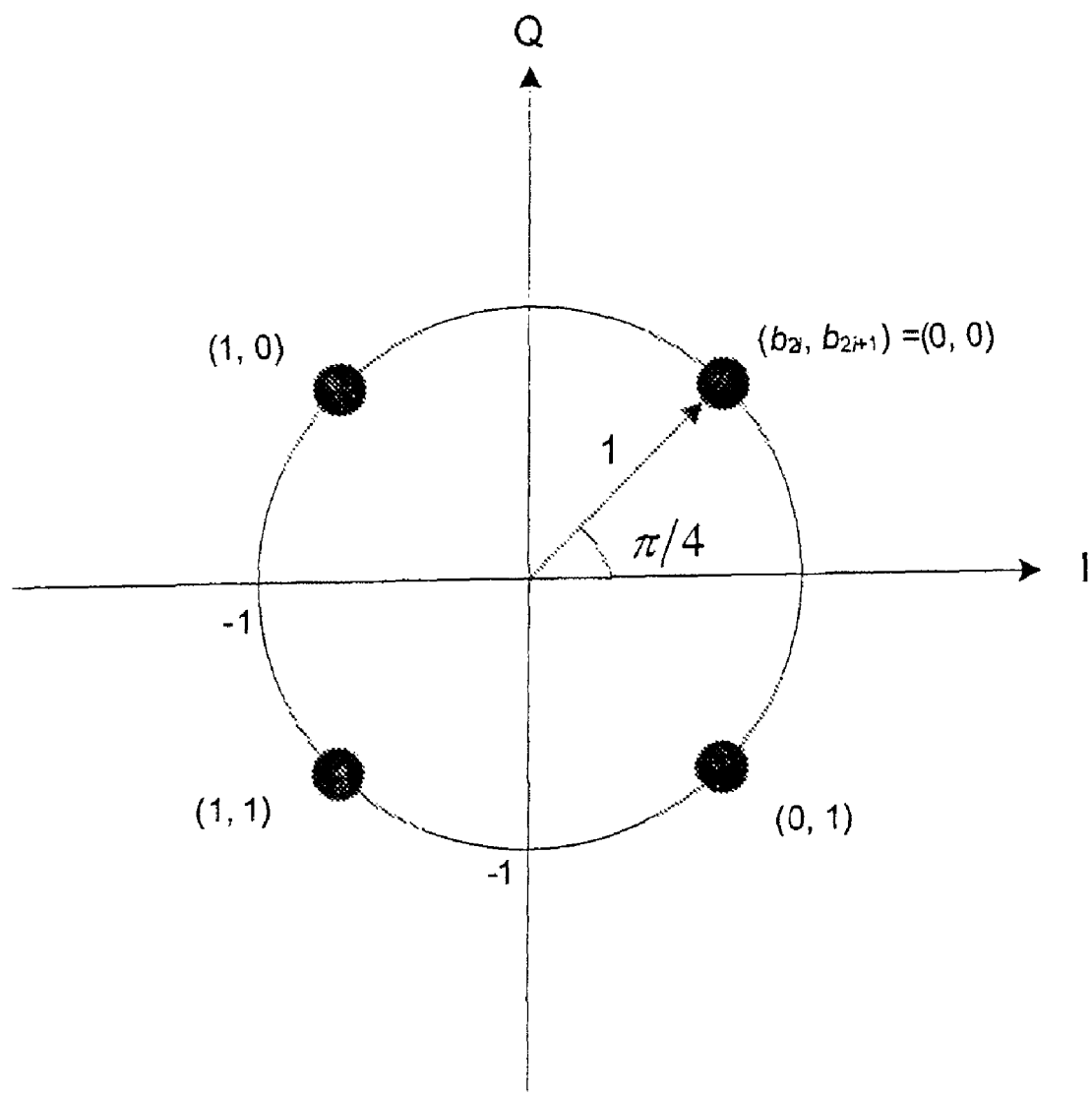
FIG. 8 illustrates the bit mapping for QPSK symbol.

As shown in FIG. 7, the QPSK bit-to-symbol mapping circuit takes a pair of bits $(b_{2i}, b_{2i+1})$ each time and maps them into an I value and a Q value, with i=0, 1, 2, . . . . The mapping logic is shown in FIG. 8, where the theoretical constellation points are defined as $$(I(i), Q(i)) = \begin{cases} (\cos(\pi/4), \sin(\pi/4)), & (b_{2i}, b_{2i+1}) = (0, 0) \\ (\cos(\pi/4), -\sin(\pi/4)), & (b_{2i}, b_{2i+1}) = (0, 1) \\ (-\cos(\pi/4), \sin(\pi/4)), & (b_{2i}, b_{2i+1}) = (1, 0) \\ (-\cos(\pi/4), -\sin(\pi/4)), & (b_{2i}, b_{2i+1}) = (1, 1) \end{cases}$$

Let $(\tilde{b}_i, \tilde{b}_{i+1})$ be the 2 bits determining the i-th symbol, for $i \in \{i | 0 \leq i \leq N_{ldpc\_bits} - 1, \text{ and } i \bmod 2 = 0\}$. Given an LDPC code and the requirement of level of error floor, there is an optimal interleaving scheme obtained through density evolution analysis. For the LDPC codes with rate ¼, ⅖, ½, ⅗, ⅔, ¾, ⅘, ⅚, 13/15, and 9/10 in "A family of LDPC codes for video broadcasting applications" filed ####, the best interleaving rule predicted by density evolution for QPSK is $$\begin{cases} \tilde{b}_i = b_{i - i \bmod 256 + (i \bmod 8) \times 32 + \lfloor \frac{i}{8} \rfloor \bmod 32} \\ \tilde{b}_{i+1} = b_{(i+1) - (i+1) \bmod 256 + ((i+1) \bmod 8) \times 32 + \lfloor \frac{i+1}{8} \rfloor \bmod 32}, \end{cases} \quad (3)$$

for $i \in \{i | 0 \leq i \leq N_{ldpc\_bits} - 1, \text{ and } i \bmod 2 = 0\}$. Where $\lfloor x \rfloor$ is the floor function which returns the largest integer that is less than or equal to x.

8PSK

Figure 9:
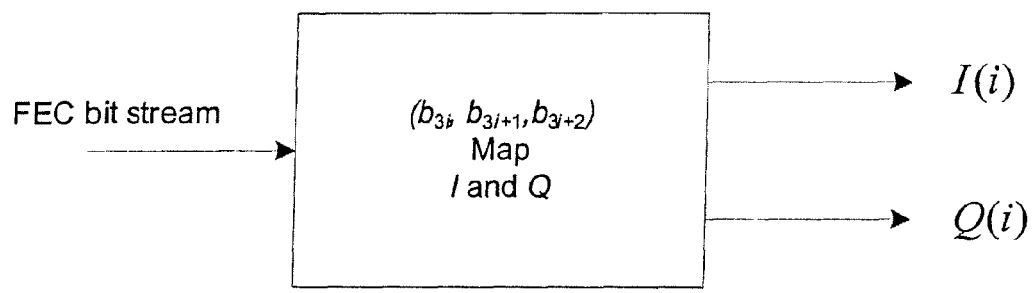
FIG. 9 illustrates the bit mapping block in 8PSK modulation.
Figure 10:
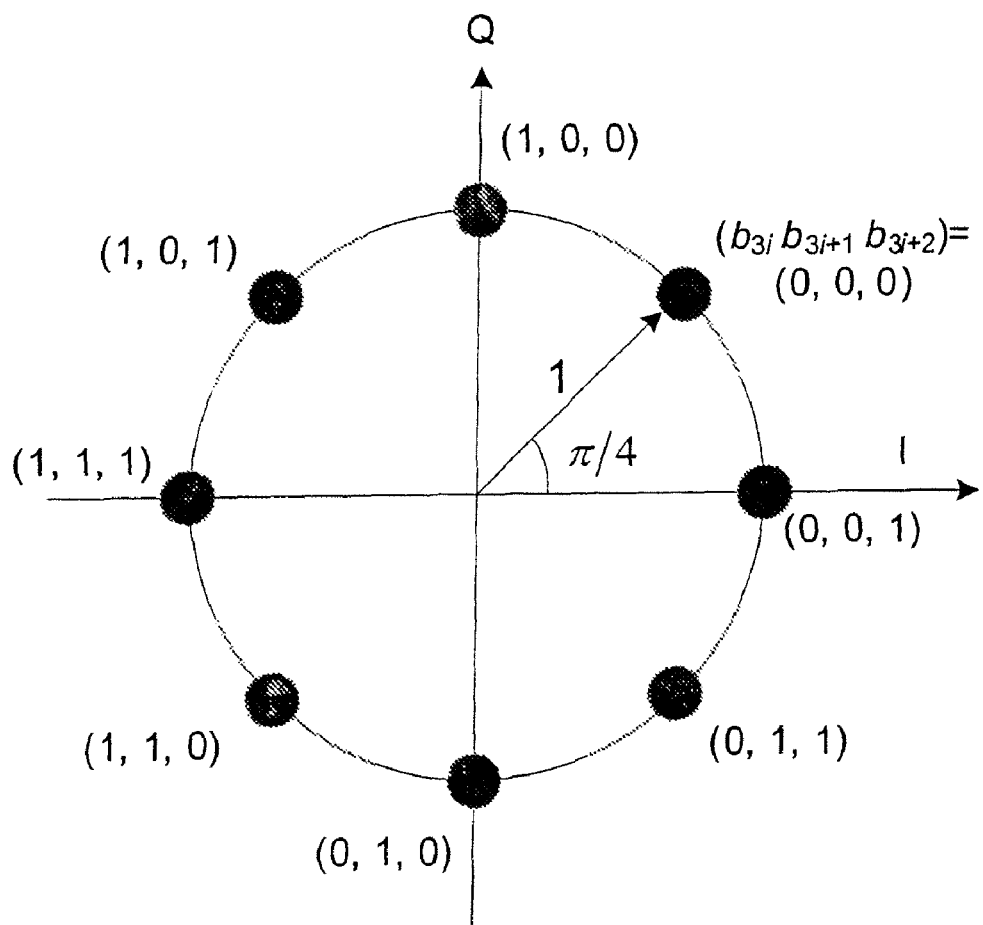
FIG. 10 illustrates the bit mapping for 8PSK symbol.

As shown in FIG. 9, the 8PSK bit-to-symbol mapping circuit takes a triplet of bits $(b_{3i}, b_{3i+1}, b_{3i+2})$ each time and maps them into an I value and a Q value, with i=0, 1, 2, . . . . The mapping logic is shown in FIG. 10, where the theoretical constellation points are defined as $$(I(i), Q(i)) = \begin{cases} (\cos(\pi/4), \sin(\pi/4)), & (b_{3i}, b_{3i+1}, b_{3i+2}) = (0, 0, 0) \\ (0, 1), & (b_{3i}, b_{3i+1}, b_{3i+2}) = (1, 0, 0) \\ (-\cos(\pi/4), \sin(\pi/4)), & (b_{3i}, b_{3i+1}, b_{3i+2}) = (1, 0, 1) \\ (-1, 0), & (b_{3i}, b_{3i+1}, b_{3i+2}) = (1, 1, 1) \\ (-\cos(\pi/4), -\sin(\pi/4)), & (b_{3i}, b_{3i+1}, b_{3i+2}) = (1, 1, 0) \\ (0, -1), & (b_{3i}, b_{3i+1}, b_{3i+2}) = (0, 1, 0) \\ (\cos(\pi/4), -\sin(\pi/4)), & (b_{3i}, b_{3i+1}, b_{3i+2}) = (0, 1, 1) \\ (1, 0), & (b_{3i}, b_{3i+1}, b_{3i+2}) = (0, 0, 1) \end{cases}$$

In 8PSK, let $(\tilde{b}_i, \tilde{b}_{i+1}, \tilde{b}_{i+2})$ be the 3 bits determining the i-th symbol, for $i \in \{i | 0 \leq i \leq N_{ldpc\_bits} - 1, \text{ and } i \bmod 3 = 0\}$. We specify a $N_{offset}$ to define the number of bit mapping for each code rate. Given an LDPC code and the requirement of level of error floor, there is an optimal interleaving scheme obtained through density evolution analysis. For the LDPC codes with rate ⅗, ⅔, ¾, ⅘, ⅚, 13/15, and 9/10 in "A family of LDPC codes for video broadcasting applications" filed ####, the interleaving rule for 8PSK is $$\begin{cases} \tilde{b}_i = b_{(8 \times \lfloor \frac{i}{768} \rfloor + N_{offset} + \frac{i}{3} \bmod 8) \times 32 + \lfloor \frac{i}{24} \rfloor \bmod 32} \\ \tilde{b}_{i+1} = b_{(8 \times \lfloor \frac{i}{768} \rfloor + N_{offset} + \frac{i}{3} \bmod 8 + 160) \times 32 + \lfloor \frac{i}{24} \rfloor \bmod 32} \\ \tilde{b}_{i+2} = b_{(\frac{i}{3} + 32 \times N_{offset} + 10240) \bmod N_{ldpc\_bits} - (\frac{i}{3}) \bmod 256 + (\frac{i}{3} \bmod 8) \times 32 + \lfloor \frac{i}{24} \rfloor \bmod 32} \end{cases} \quad (4)$$

for $i \in \{i | 0 \leq i \leq N_{ldpc\_bits} - 1, \text{ and } i \bmod 3 = 0\}$. The numbers of bit offset is summarized in

TABLE 1

Offset values for interleaving in 8PSK.

| Rate | $N_{Offset}$ |
| --- | --- |
| 3/5 | 40 |
| 2/3 | 40 |
| 3/4 | 80 |
| 5/6 | 88 |
| 13/15 | 104 |
| 9/10 | 160. |

We claim:

1. A digital communications transmitter interleaving LDPC encoded bits in a QPSK modulation system based on a rule:

$$\begin{cases} \tilde{b}_i = b_{i - i \bmod 256 + (i \bmod 8) \times 32 + \lfloor \frac{i}{8} \rfloor \bmod 32} \\ \tilde{b}_{i+1} = b_{(i+1) - (i+1) \bmod 256 + ((i+1) \bmod 8) \times 32 + \lfloor \frac{i+1}{8} \rfloor \bmod 32}, \end{cases}$$

for $i \in \{i | 0 \leq i \leq N_{ldpc\_bits} - 1, \text{ and } i \bmod 2 = 0\} i \in \{i | 0 \leq i \leq N_{ldpc\_bits} - 1, \text{ and } i \bmod 2 = 0\}$, where $\lfloor x \rfloor$ is the floor function which returns the largest integer that is less than or equal to x, $N_{ldpc\_bits} = 15360$ is the codeword length of the LDPC code in use.

2. A digital communications receiver employing an LDPC decoder for decoding interleaved LDPC encoded bits in a QPSK modulation mode based on a rule:

$$\begin{cases} \tilde{b}_i = b_{i - i \bmod 256 + (i \bmod 8) \times 32 + \lfloor \frac{i}{8} \rfloor \bmod 32} \\ \tilde{b}_{i+1} = b_{(i+1) - (i+1) \bmod 256 + ((i+1) \bmod 8) \times 32 + \lfloor \frac{i+1}{8} \rfloor \bmod 32}, \end{cases}$$

for $i \in \{i | 0 \leq i \leq N_{ldpc\_bits} - 1, \text{ and } i \bmod 2 = 0\}$, where $\lfloor x \rfloor$ is the floor function which returns the largest integer that is less than or equal to x, $N_{ldpc\_bits} = 15360$ is the codeword length of the LDPC code in use.

3. A computer readable medium storing a computer program for performing a method specifying an interleaving scheme of LDPC encoded bits in a QPSK modulation system base on a rule:

$$\begin{cases} \tilde{b}_i = b_{i-i\bmod 256+(i\bmod 8)\times 32+\lfloor \frac{i}{8} \rfloor \bmod 32} \\ \tilde{b}_{i+1} = b_{(i+1)-(i+1)\bmod 256+((i+1)\bmod 8)\times 32+\lfloor \frac{i+1}{8} \rfloor \bmod 32}, \end{cases}$$

for i∈{i|0≦i≦$N_{ldpc\_bits}$−1, and imod2=0}, where $\lfloor x \rfloor$ is the floor function which returns the largest integer that is less than or equal to x, $N_{ldpc\_bits}$=15360 is the codeword length of the LDPC code in use.

4. A digital communications transmitter interleaving LDPC encoded bits in a 8PSK modulation system based on a rule:

$$\begin{cases} \tilde{b}_i = b_{(8\times \lfloor \frac{i}{768} \rfloor + N_{offset}+\frac{i}{3}\bmod 8)\times 32+\lfloor \frac{i}{24} \rfloor \bmod 32} \\ \tilde{b}_{i+1} = b_{(8\times \lfloor \frac{i}{768} \rfloor + N_{offset}+\frac{i}{3}\bmod 8+160)\times 32+\lfloor \frac{i}{24} \rfloor \bmod 32} \\ \tilde{b}_{i+2} = b_{(\frac{i}{3}+32\times N_{offset}+10240)\bmod N_{idpc\_bits}-(\frac{i}{3})\bmod 256+(\frac{i}{3}\bmod 8)\times 32+\lfloor \frac{i}{24} \rfloor \bmod 32} \end{cases}$$

for i∈{i|0≦i≦$N_{ldpc\_bits}$−1, and imod3=0}, where $\lfloor x \rfloor$ is the floor function which returns the largest integer that is less than or equal to x, $N_{ldpc\_bits}$=15360 is the codeword length of the LDPC code in use, and the offset values $N_{Offset}$ for different code rates are defined as:

| Rate | $N_{Offset}$ |
|---|---|
| 3/5 | 40 |
| 2/3 | 40 |
| 3/4 | 80 |
| 5/6 | 88 |
| 13/15 | 104 |
| 9/10 | 160. |

5. A digital communications receiver employing an LDPC decoder for decoding interleaved LDPC encoded bits in a 8PSK modulation system based on a rule:

$$\begin{cases} \tilde{b}_i = b_{(8\times \lfloor \frac{i}{768} \rfloor + N_{offset}+\frac{i}{3}\bmod 8)\times 32+\lfloor \frac{i}{24} \rfloor \bmod 32} \\ \tilde{b}_{i+1} = b_{(8\times \lfloor \frac{i}{768} \rfloor + N_{offset}+\frac{i}{3}\bmod 8+160)\times 32+\lfloor \frac{i}{24} \rfloor \bmod 32} \\ \tilde{b}_{i+2} = b_{(\frac{i}{3}+32\times N_{offset}+10240)\bmod N_{idpc\_bits}-(\frac{i}{3})\bmod 256+(\frac{i}{3}\bmod 8)\times 32+\lfloor \frac{i}{24} \rfloor \bmod 32} \end{cases}$$

for i∈{i|0≦i≦$N_{ldpc\_bits}$−1, and imod3=0}, where $\lfloor x \rfloor$ is the floor function which returns the largest integer that is less than or equal to x, $N_{ldpc\_bits}$=15360 is the codeword length of the LDPC code in use, and the offset values $N_{Offset}$ for different code rates are defined as:

| Rate | $N_{Offset}$ |
|---|---|
| 3/5 | 40 |
| 2/3 | 40 |
| 3/4 | 80 |
| 5/6 | 88 |
| 13/15 | 104 |
| 9/10 | 160. |

6. A computer readable medium storing a computer program for performing a method specifying an interleaving scheme of LDPC encoded bits in an 8PSK modulation system base on a rule:

$$\begin{cases} \tilde{b}_i = b_{(8\times \lfloor \frac{i}{768} \rfloor + N_{offset}+\frac{i}{3}\bmod 8)\times 32+\lfloor \frac{i}{24} \rfloor \bmod 32} \\ \tilde{b}_{i+1} = b_{(8\times \lfloor \frac{i}{768} \rfloor + N_{offset}+\frac{i}{3}\bmod 8+160)\times 32+\lfloor \frac{i}{24} \rfloor \bmod 32} \\ \tilde{b}_{i+2} = b_{(\frac{i}{3}+32\times N_{offset}+10240)\bmod N_{idpc\_bits}-(\frac{i}{3})\bmod 256+(\frac{i}{3}\bmod 8)\times 32+\lfloor \frac{i}{24} \rfloor \bmod 32} \end{cases}$$

for i∈{i|0≦i≦$N_{ldpc\_bits}$−1, and imod3=0}, where $\lfloor x \rfloor$ is the floor function which returns the largest integer that is less than or equal to x, $N_{ldpc\_bits}$=15360 is the codeword length of the LDPC code in use, and the offset values $N_{Offset}$ for different code rates are defined as:

| Rate | $N_{Offset}$ |
|---|---|
| 3/5 | 40 |
| 2/3 | 40 |
| 3/4 | 80 |
| 5/6 | 88 |
| 13/15 | 104 |
| 9/10 | 160. |

\* \* \* \* \*